United States Patent
Song

(10) Patent No.: US 9,424,905 B2
(45) Date of Patent: Aug. 23, 2016

(54) METHOD OF OPERATING SEMICONDUCTOR MEMORY DEVICE

(71) Applicant: Jungwoo Song, Hwaseong-si (KR)

(72) Inventor: Jungwoo Song, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 193 days.

(21) Appl. No.: 14/512,016

(22) Filed: Oct. 10, 2014

(65) Prior Publication Data

US 2015/0162080 A1 Jun. 11, 2015

(30) Foreign Application Priority Data

Dec. 5, 2013 (KR) .......................... 10-2013-0150784

(51) Int. Cl.
*G11C 11/16* (2006.01)
*G11C 13/00* (2006.01)

(52) U.S. Cl.
CPC ....... *G11C 11/1675* (2013.01); *G11C 13/0069* (2013.01); *G11C 13/0004* (2013.01); *G11C 13/0007* (2013.01); *G11C 2013/009* (2013.01); *G11C 2013/0092* (2013.01); *G11C 2213/32* (2013.01); *G11C 2213/72* (2013.01)

(58) Field of Classification Search
CPC .............. G11C 13/00; G11C 13/0038; G11C 13/0069; G11C 13/0004; G11C 13/0007; G11C 2013/0092; G11C 2213/32; G11C 2213/72; G11C 11/16; G11C 11/1675
USPC ................................. 365/171, 148, 158, 163
See application file for complete search history.

(56) References Cited

U.S. PATENT DOCUMENTS

| | | | |
|---|---|---|---|
| 6,680,862 B2 | 1/2004 | Hidaka | |
| 6,788,570 B2 | 9/2004 | Kim et al. | |
| 6,950,369 B2 | 9/2005 | Kunikiyo et al. | |
| 6,972,996 B2 | 12/2005 | Hosono et al. | |
| 7,084,437 B2 | 8/2006 | Kitamura et al. | |
| 7,616,478 B2 | 11/2009 | Schwabe et al. | |
| 7,859,885 B2 * | 12/2010 | Toda | G11C 8/08 365/148 |
| 7,869,265 B2 | 1/2011 | Shimizu et al. | |
| 7,872,906 B2 | 1/2011 | Miura et al. | |
| 8,289,746 B2 | 10/2012 | Chen et al. | |
| 8,619,461 B2 | 12/2013 | Sakamoto | |
| 2004/0202041 A1 | 10/2004 | Hidenori | |
| 2007/0285963 A1 * | 12/2007 | Toda | G11C 5/02 365/148 |

(Continued)

FOREIGN PATENT DOCUMENTS

| | | | |
|---|---|---|---|
| JP | 2011060389 A | 3/2011 | |
| KR | 10-0866731 B1 | 10/2008 | |

(Continued)

*Primary Examiner* — Tan T Nguyen
(74) *Attorney, Agent, or Firm* — Volentine & Whitt, PLLC

(57) ABSTRACT

A semiconductor memory device includes a variable resistance memory element connected between first and second conductive lines intersecting each other, and a PN junction diode connected between the variable resistance memory element and the first conductive line. The method of operating the semiconductor device includes supplying the variable resistance memory element with a first directional current flowing from the second conductive line to the first conductive line by applying a first forward bias to the PN junction diode, and supplying the variable resistance memory element with a second directional current flowing from the first conductive line to the second conductive line by applying a reverse bias to the PN junction diode immediately after applying a second forward bias to the PN junction diode.

20 Claims, 17 Drawing Sheets

(56) References Cited

U.S. PATENT DOCUMENTS

| | | | |
|---|---|---|---|
| 2008/0106922 A1* | 5/2008 | Park | G11C 11/16 365/72 |
| 2010/0238701 A1* | 9/2010 | Tsukamoto | G11C 11/5685 365/148 |
| 2011/0063889 A1 | 3/2011 | Fukano | |
| 2012/0320662 A1 | 12/2012 | Ichihara et al. | |
| 2013/0039118 A1 | 2/2013 | Tsukada | |
| 2013/0077380 A1* | 3/2013 | Sakamoto | G11C 13/0007 365/148 |
| 2015/0162080 A1* | 6/2015 | Song | G11C 13/0069 365/148 |

FOREIGN PATENT DOCUMENTS

| | | |
|---|---|---|
| KR | 10-1098302 B1 | 12/2011 |
| KR | 20120074187 A | 7/2012 |

* cited by examiner

| | WL | | BL | |
|---|---|---|---|---|
| | SEL | UNSEL | SEL | UNSEL |
| Write '0' | Vs | $V_F$ | $V_F$ | Vs |
| Write '1' | Vs | $V_F$ | $V_F \rightarrow V_R$ | Vs |
| Read | Vs | Vread | Vread | Vs |

METHOD OF OPERATING SEMICONDUCTOR MEMORY DEVICE

CROSS-REFERENCE TO RELATED APPLICATION

A claim of priority under 35 U.S.C. §119 is made to Korean Patent Application No. 10-2013-0150784, filed on Dec. 5, 2013, in the Korean Intellectual Property Office, the disclosure of which is hereby incorporated by reference in its entirety.

BACKGROUND

The inventive concepts relate to methods of operating a semiconductor memory device and, more particularly, to methods of operating a semiconductor memory device which includes a variable resistance memory element.

Semiconductor memory devices may be classified as either volatile memory devices or nonvolatile memory devices. Volatile memory devices are generally characterized by the loss of stored data when a power supply is interrupted. Examples of volatile memory devices include a dynamic random access memory (DRAM) devices and a static random access memory (SRAM) devices. Nonvolatile memory devices are generally characterized by the retention of stored data even when a power supply is interrupted. Examples of nonvolatile memory devices include programmable read only memory (PROM) devices, erasable PROM (EPROM) devices, electrically EPROM (EEPROM) devices, and flash memory devices.

Other examples of nonvolatile semiconductor memory devices include ferroelectric random access memory (FRAM) devices, magnetic random access memory (MRAM) devices, phase change random access memory (PRAM) devices, and resistive random access memory (RRAM) devices. The devices, which may be referred to as types of variable resistance memory device, are characterized by memory cells having programmable resistance values or states according to a supplied current or a supplied voltage. The programmed resistance values of these memory devices can be maintained even when a power supply is interrupted.

SUMMARY

Some embodiments of the inventive concepts provides a method of operating a semiconductor memory device comprising: a variable resistance memory element connected between first and second conductive lines intersecting each other; and a PN junction diode connected between the variable resistance memory element and the first conductive line. The method may include: supplying the variable resistance memory element with a first directional current flowing from the second conductive line to the first conductive line by applying a first forward bias to the PN junction diode; and supplying the variable resistance memory element with a second directional current flowing from the first conductive line to the second conductive line by applying a reverse bias to the PN junction diode immediately after applying a second forward bias to the PN junction diode.

In some embodiments, a time for which the second forward bias is applied may be shorter than a time for which the first forward bias is applied.

In some embodiments, supplying the variable resistance memory element with the first directional current may include: switching the variable resistance memory element from a first resistance state to a second resistance state, and supplying the variable resistance memory element with the second directional current may include: switching the variable resistance memory element from the second resistance state to the first resistance state.

In some embodiments, a time for the second directional current to be supplied may be shorter than a time for the first directional current to be supplied and may be longer than a time for the variable resistance memory element to be switched from the second resistance state to the first resistance state.

In some embodiments, supplying the variable resistance memory element with the first directional current may include: applying a first voltage level to the first conductive line; and applying a second voltage level greater than the first voltage level to the second conductive line. Supplying the variable resistance memory element with the second directional current may include: applying the first voltage level to the first conductive line; and immediately after applying the second voltage level to the second conductive line, applying a third voltage level less than the first voltage level to the second conductive line.

In some embodiments, the variable resistance memory element comprises a magnetic tunnel junction including a reference magnetic layer, a free magnetic layer, and a tunnel barrier layer disposed therebetween.

In some embodiments, a time for the second directional current to be supplied is longer than a time for a magnetization direction of the free magnetic layer to be switched.

In some embodiments, supplying the variable resistance memory element with the first directional current comprises switching magnetization directions of the reference and free magnetic layers to be parallel to each other, and supplying the variable resistance memory element with the second directional current comprises switching magnetization directions of the reference and free magnetic layers to be anti-parallel to each other.

Other embodiments of the inventive concepts provides a method of operating a semiconductor memory device comprising: first conductive lines and second conductive lines intersecting each other; switching elements connected between the first conductive lines and the second conductive lines, each of the switching elements including a first conductivity type semiconductor layer and a second conductivity type semiconductor layer contacting the first conductivity type semiconductor layer; and variable resistance memory elements connected between the switching elements and the second conductive lines. The method may include: switching a selected variable resistance memory element to a first resistance state by applying a first voltage level to the second conductive line connected to the selected variable resistance memory element; and switching the selected variable resistance memory element to a second resistance state by applying a second voltage level less than the first voltage level to the second conductive line connected to the selected variable resistance memory element immediately after applying the first voltage level to the second conductive line connected to the selected variable resistance memory element.

In some embodiments, a time for the first voltage level to be applied when the selected variable resistance memory element is switched to the second resistance state may be shorter than a time for the first voltage level to be applied when the selected variable resistance memory element is switched to the first resistance state.

In some embodiments, a third voltage level less than the first voltage level and greater than the second voltage level may be applied to the first conductive line connected to the selected variable resistance memory element.

In some embodiments, the first conductivity type semiconductor layer may be in contact with the first conductive line, and the second conductivity type semiconductor layer is may be contact with the variable resistance memory element. In this case, a dopant concentration in the first conductivity type semiconductor layer may be lower than a dopant concentration in the second conductivity type semiconductor layers.

In some embodiments, the dopant concentration in the first conductivity type semiconductor layer may be in a range of about $1 \times 10^{17}/cm^3$ to about $1 \times 10^{18}/cm^3$, and the dopant concentration in the second conductivity type semiconductor layer may be in a range of about $1 \times 10^{20}/cm^3$ to about $1 \times 10^{21}/cm^3$.

In some embodiments, switching the variable resistance memory element to the second resistance state may include: immediately after accumulating minority carries in the first conductivity type semiconductor layer and the second conductivity type semiconductor layer, discharging the accumulated minority carriers.

In some embodiments, switching the variable resistance memory element to the first resistance state may include: supplying a first directional current flowing from the second conductive line to the first conductive line connected to the selected variable resistance memory element, and switching the variable resistance memory element to the second resistance state may include: supplying a second directional current flowing from the first conductive line to the second conductive line connected to the selected variable resistance memory element.

In some embodiments, a time for the second directional current to be supplied may be shorter than a time for the first directional current to be supplied and may be longer than a time for the variable resistance memory element to be switched from the first resistance state to the second resistance state.

In some embodiments, the method further includes applying the first voltage level to the first conductive line connected to an unselected variable resistance memory element, and applying a third voltage level to the second conductive line connected to the unselected variable resistance memory element. The third voltage level is less than the first voltage level and greater than the second voltage level.

In some embodiments, each of the variable resistance memory elements comprises a magnetic tunnel junction including a reference magnetic layer, a free magnetic layer, and a tunnel barrier layer disposed therebetween.

In some embodiments, a time for the first voltage level to be applied when the selected variable resistance memory element is switched to the second resistance state is longer than a time for a magnetization direction of the free magnetic layer to be switched.

In some embodiments, switching the variable resistance memory element to the first resistance state comprises switching magnetization directions of the reference and free magnetic layers to be parallel to each other, and switching the variable resistance memory element to the second resistance state comprises switching magnetization directions of the reference and free magnetic layers to be anti-parallel to each other.

BRIEF DESCRIPTION OF THE DRAWINGS

The inventive concepts will become readily apparent from the detailed description that follows, with reference to the accompanying drawings, in which.

DETAILED DESCRIPTION OF THE EMBODIMENTS

Figure 1:
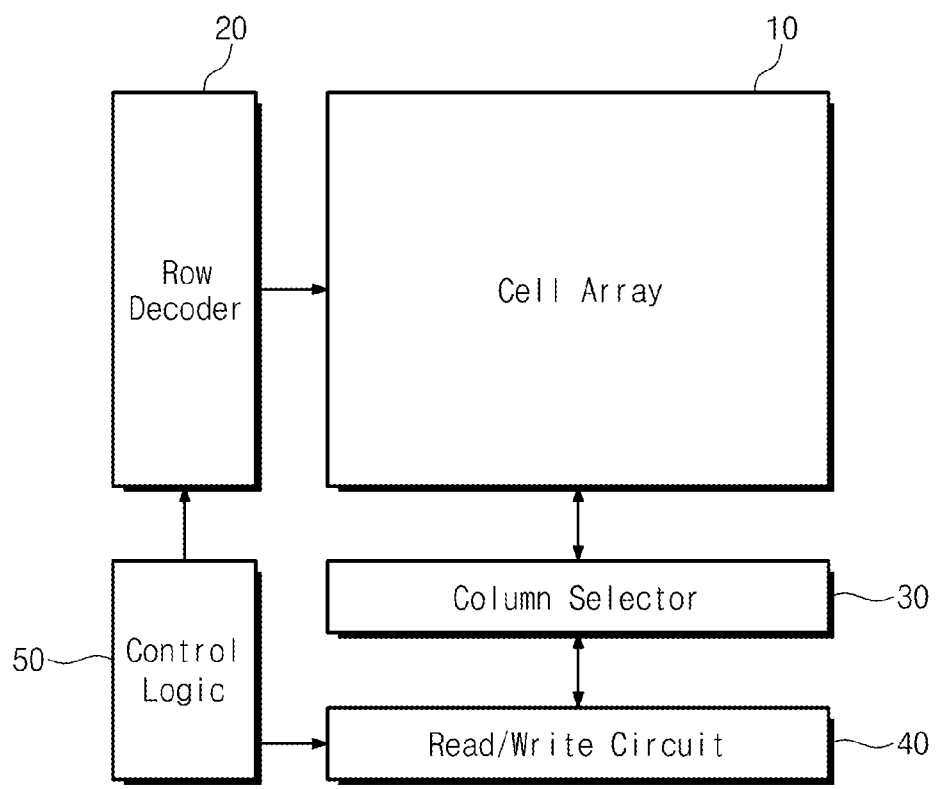
FIG. 1 is a schematic block diagram illustrating a semiconductor memory device according to an exemplary embodiment of the inventive concept.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a semiconductor memory device according to an exemplary embodiment of the inventive concept.

Referring to FIG. 1, a semiconductor memory device includes a memory cell array 10, a row decoder 20, a column selector 30, a read/write circuit 40, and a control logic 50.

The memory cell array 10 includes a plurality of word lines, a plurality of bit lines, and memory cells connected to intersecting points of the word lines and the bit lines. An example of the memory cell array 10 will be described later in detail with reference to FIG. 2.

The row decoder 20 is connected to the memory cell array 10 through the word lines. The row decoder 20 decodes an address signal inputted from an external system to select one of the word lines.

The column selector 30 is connected to the memory cell array 10 through the bit lines and decodes an address signal inputted from the external system to select one of the bit lines. The bit line selected in the column selector 30 may be connected to the read/write circuit 40.

The read/write circuit 40 provides a bit line bias for accessing a selected memory cell according to control of the control logic 50. The read/write circuit 40 provides a bit line voltage in order to write an inputted datum into the selected memory cell or to read a datum stored in the selected memory cell.

The control logic 50 outputs control signals for controlling the semiconductor memory device according to a command signal provided from the external system. The control signals outputted from the control logic 50 may control the read/write circuit 40.

Figure 2:
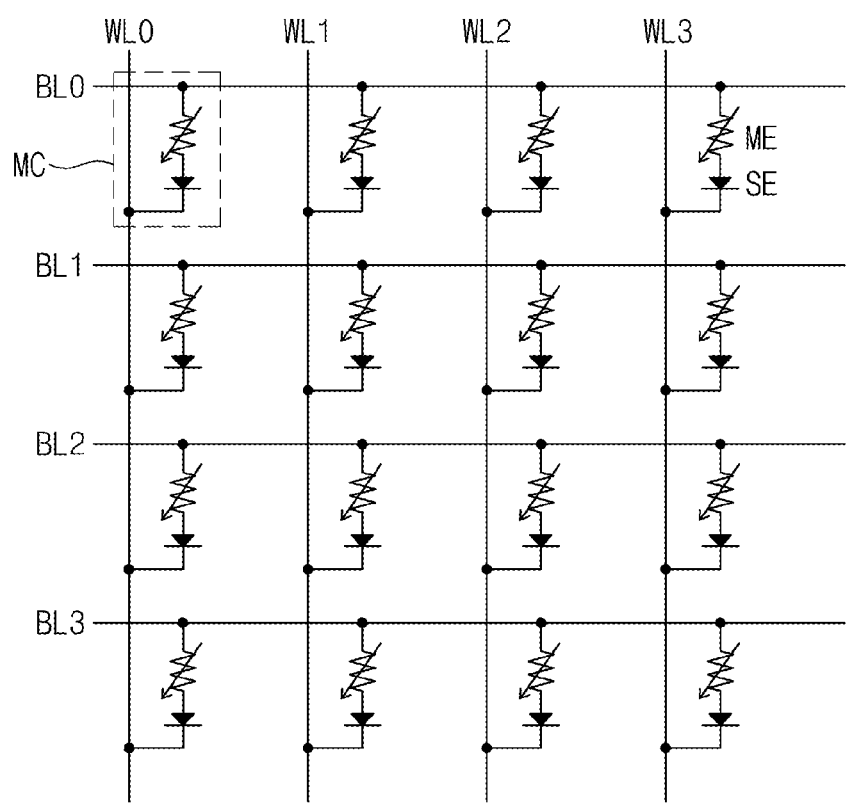
FIG. 2 is a circuit diagram of a memory cell array of a semiconductor memory device according to an exemplary embodiment of the inventive concept.

FIG. 2 is a circuit diagram of a memory cell array of a semiconductor memory device according to an exemplary embodiment of the inventive concept.

Referring to FIG. 2, the memory cell array 10 includes a plurality of word lines WL0 to WL3, a plurality of bit line BL0 to BL3, and unit memory cells MC. The unit memory cells MC may be two-dimensionally arranged. The unit memory cells MC may be connected between the word lines WL0 to WL3 and the bit lines BL0 to BL3 intersecting each other. Each of the unit memory cells MC includes a memory element ME and a selection element SE. The memory element ME is connected between one of the bit lines BL0 to BL3 and the selection element SE, and the selection element SE is connected between the memory element ME and one of the word lines WL0 to WL3. The memory element ME may be a variable resistance element capable of being switched between two resistance states by an electrical pulse applied thereto.

According to some embodiments, the memory element ME may have a thin layer structure of which an electrical resistance can be changed using spin torque transfer of electrons in a current passing through the thin layer structure. The thin layer structure of the memory element ME may have a magnetoresistance characteristic. In this case, the memory element ME may include at least one ferromagnetic material. The memory element ME may further include at least one antiferromagnetic material.

According to other embodiments, the memory element ME may include a phase change material of which a phase can be changed according to the amount of a current passing through the phase change material. The phase change material may include at least one of various kinds of materials such as two-element compounds (e.g., GaSb, InSb, InSe, $Sb_2Te_3$, and GeTe), three-element compounds (e.g., GeSbTe, GaSeTe, InSbTe, $SnSb_2Te_4$, and InSbGe), and four-element compounds (e.g., AgInSbTe, (GeSn)SbTe, GeSb(SeTe), and $Te_{81}Ge_{15}Sb_2S_2$). The phase of phase change material may be changed into one of an amorphous state having a relatively high resistance and a crystalline state having a relatively low resistance by a temperature of supplied heat. The phase of the phase change material may be changed by Joule's heat occurring according to the amount of the current. The memory element ME may write and read data using the phase change.

According to still other embodiments, the memory element ME may include at least one of perovskite compounds or transition metal oxides.

The selection element SE may be connected between one of the word lines WL0 to WL3 and the memory element ME and may control a current supplied to the memory element ME according to voltages of the word lines WL0 to WL3. In some embodiments, the selection element SE may be a PN junction diode or a PIN junction diode. An anode of the diode may be connected to the memory element ME, and a cathode of the diode may be connected to one of the word lines WL0 to WL3.

Figure 3:
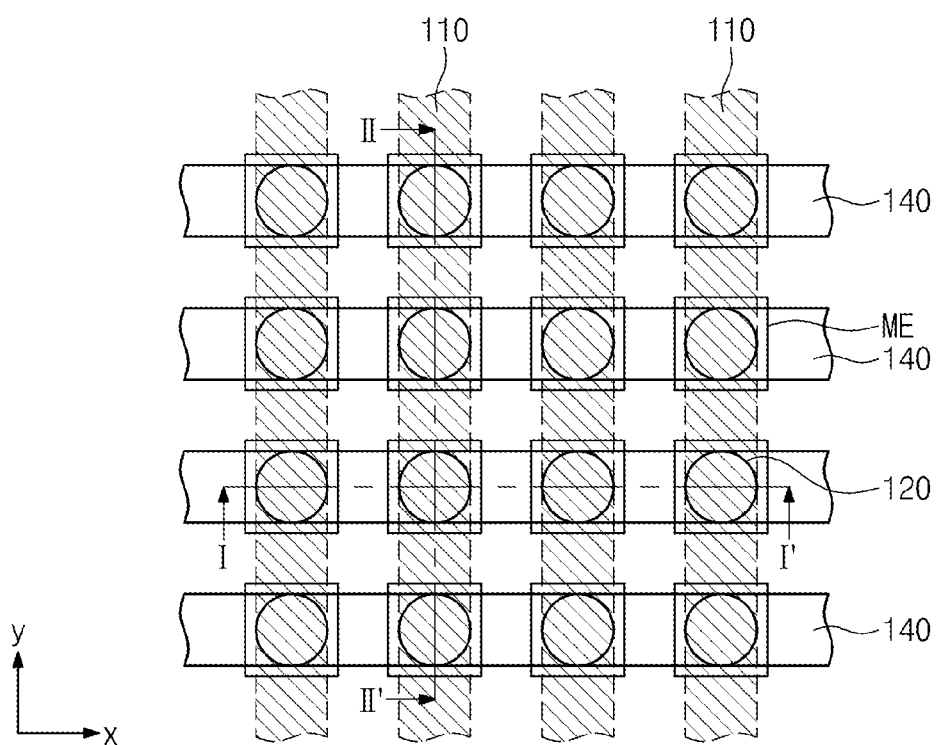
FIG. 3 is a plan view illustrating a semiconductor memory device according to an exemplary embodiment of the inventive concept.
Figure 4:
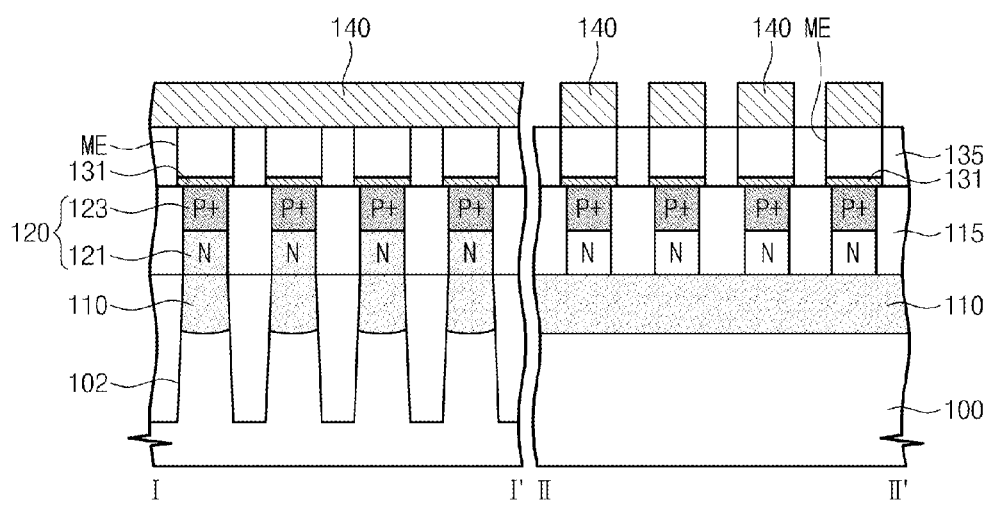
FIG. 4 is a cross-sectional view taken along line I-I' of FIG. 3 according to an exemplary embodiment of the inventive concept.

FIG. 3 is a plan view illustrating a semiconductor memory device according to an exemplary embodiment of the inventive concept. FIG. 4 is a cross-sectional view taken along the line I-I' of FIG. 3 according to an exemplary embodiment of the inventive concept.

Referring to FIGS. 3 and 4, a semiconductor device may include word lines 110 and bit lines 140 intersecting the word lines 110 and may include selection elements and memory elements which are respectively disposed in intersecting regions of the word lines 110 and the bit lines 140 when viewed from a plan view. The selection elements and the memory elements may be two-dimensionally arranged on a semiconductor substrate 100.

In an embodiment, device isolation patterns 102 may be formed in the semiconductor substrate 100 to define active regions. The semiconductor substrate 100 may be formed of a single-crystalline semiconductor material. For example, the semiconductor substrate 10 may be a silicon substrate, a silicon-on-insulator (SOI) substrate, a germanium substrate, a germanium-on-insulator (GOI) substrate, a silicon-germanium substrate, or a substrate including an epitaxial layer formed by performing a selective epitaxial growth (SEG) process.

In some embodiments, the device isolation patterns 102 may have linear shapes extending in a y-axis direction, and thus, the active regions having linear shapes may be defined in the semiconductor substrate 100. The semiconductor substrate 100 may be patterned to form trenches, and an insulating material may be then formed in the trenches to form the device isolation patterns 102.

In some embodiments, word lines 110 may be formed in the active regions of the semiconductor substrate 100 after or before the formation of the device isolation patterns 102. The word lines 110 may have linear shapes extending in the y-axis direction. The word lines 110 may be formed between the device isolation patterns 102.

In some embodiments, the word lines 110 may be dopant regions formed by doping the semiconductor substrate 100 with dopants. In this case, the word lines 110 may be formed to have a conductivity type different from that of the semiconductor substrate 100. For example, if the semiconductor substrate 100 is formed of a P-type semiconductor material, the word lines 110 may be formed by heavily doping the semiconductor substrate 100 with N-type dopants. Alternatively, the word lines 110 may be formed of a metal layer including a metal material.

A first interlayer insulating layer 115 may be disposed on the semiconductor substrate 100 having the word lines 110. The first interlayer insulating layer 115 may have two-dimensionally arranged openings. The openings may expose portions of the word lines 110. The first interlayer insulating layer 115 may be formed of an oxide (e.g., silicon oxide), a nitride (e.g., silicon nitride), and/or an oxynitride (e.g., silicon oxynitride).

In some embodiments, a semiconductor pattern 120 for the selection element may be disposed in each of the openings of the first interlayer insulating layer 115. The semiconductor patterns 120 may include silicon, germanium, or silicon-germanium. The semiconductor patterns 120 may be formed by a selective epitaxial growth (SEG) process using the semiconductor substrate 100 as a seed. The semiconductor pattern 120 formed by the SEG process may have a substantially single-crystalline structure.

Each of the semiconductor patterns 120 may include a first portion 121 and a second portion 123 having conductivity types opposite to each other. The first portion 121 may be doped with dopants of the same conductivity type as the word line 110 so as to be electrically connected to the word line 110. The second portion 123 may be doped with dopants of a conductivity type opposite to that of the first portion 121. A concentration of the dopants in the second portion 123 may be greater than a concentration of the dopants in the first portion 121. A PN junction may be formed at an interface between the first portion 121 and the second portion 123. In other words, the selection element of a PN junction diode may be formed in each of the semiconductor patterns 120.

Data storage patterns ME for the memory elements may be disposed on the semiconductor patterns 120, respectively. The data storage patterns ME may store logical data and may be two-dimensionally arranged when viewed from a plan view. For example, each of the data storage patterns ME may include a magnetic tunnel junction using magnetization directions, a transition metal oxide using an electrical path, or a phase change material. The data storage patterns ME may be realized, for example, as any one of exemplary data storage patterns illustrated in FIGS. 5A to 5F which will be described in more detail later.

An ohmic pattern 131 may be disposed between each of the data storage patterns ME and each of the semiconductor patterns 120. The ohmic pattern 131 may include a metal silicide such as titanium silicide, cobalt silicide, tantalum silicide, or tungsten silicide.

A second interlayer insulating layer 135 may be disposed on the first interlayer insulating layer 115. The second interlayer insulating layer 135 may fill a space between the data storage patterns ME. A top surface of the second interlayer insulating layer 135 may be substantially coplanar with top surfaces of the data storage patterns ME. The second interlayer insulating layer 135 may be formed of an oxide (e.g., silicon oxide), a nitride (e.g., silicon nitride), and/or an oxynitride (e.g., silicon oxynitride).

The bit lines 140 extending in an x-axis direction may be disposed on the data storage patterns ME. Each of the bit lines 140 may be electrically connected to the data storage patterns ME arranged in the x-axis direction. The bit lines 140 may include at least one of a metal (e.g., tungsten, aluminum, titanium, and/or tantalum), a conductive metal nitride (e.g. titanium nitride, tantalum nitride, and/or tungsten nitride), or a metal-semiconductor compound (e.g., a metal silicide).

FIGS. 5A to 5F are cross-sectional views of examples of memory elements of a semiconductor memory device according to an exemplary embodiment of the inventive concept.

Figure 5A:
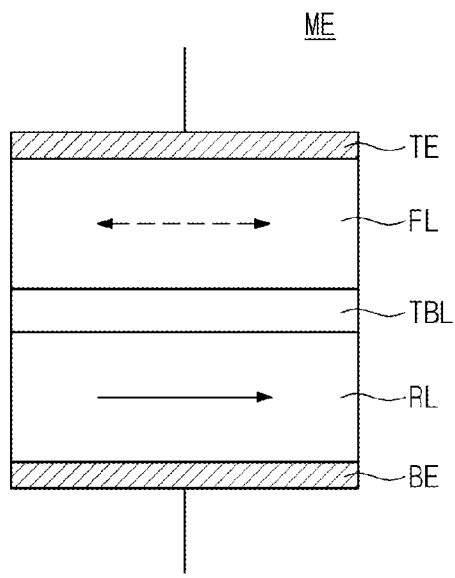
FIGS. 5A through 5F are cross-sectional views of respective memory elements of a semiconductor memory device according to an exemplary embodiment of the inventive concept.
Figure 5B:
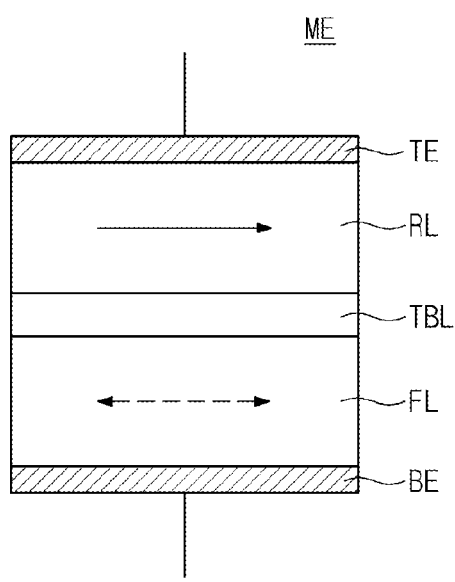

According to embodiments illustrated in FIGS. 5A and 5B, each of the data storage patterns ME may include a reference magnetic layer RL, a free magnetic layer FL, and a tunnel barrier layer TBL between the reference magnetic layer RL and the free magnetic layer FL. The reference magnetic layer RL has a magnetization direction fixed in one direction, and the free magnetic layer FL has a magnetization direction changeable between a direction parallel to and a direction anti-parallel to the magnetization direction of the reference magnetic layer RL. The magnetization directions of the reference magnetic layer RL and the free magnetic layer FL may be parallel to a top surface of the tunnel barrier layer TBL. The reference magnetic layer RL, the free magnetic layer FL, and the tunnel barrier layer TBL may constitute a magnetic tunnel junction (MTJ).

An electrical resistance of the MTJ may be greater when the magnetization directions of the reference and free magnetic layers RL and FL are anti-parallel to each other than when the magnetization directions of the reference and free magnetic layers RL and FL are parallel to each other. The electrical resistance of the MTJ may be controlled by changing the magnetization direction of the free magnetic layer FL. The magnetization direction of the free magnetic layer FL may be changed by spin torque of electrons in a write current. As a result, the data storage patterns ME including the MTJ may store data using an electrical resistance difference according to magnetization directions of the reference and free magnetic layers RL and FL.

Each of the reference and free magnetic layers RL and FL may include a ferromagnetic material. In some embodiments, the reference magnetic layer RL may further include an antiferromagnetic material pinning the magnetization direction of the ferromagnetic material included in the reference magnetic layer RL. The tunnel barrier layer TBL may include at least one of magnesium oxide, titanium oxide, aluminum oxide, magnesium-zinc oxide, or magnesium-boron oxide.

Each of the data storage patterns ME may further include a bottom electrode BE and a top electrode TE. The reference magnetic layer RL, the tunnel barrier layer TBL, and the free magnetic layer FL may be disposed between the bottom electrode BE and the top electrode TE. As illustrated in FIG. 5A, the reference magnetic layer RL may be disposed between the bottom electrode BE and the tunnel barrier layer TBL, and the free magnetic layer FL may be disposed between the top electrode TE and the tunnel barrier layer TBL. Alternatively, as illustrated in FIG. 5B, the free magnetic layer FL may be disposed between the bottom electrode BE and the tunnel barrier layer TBL, and the reference magnetic layer RL may be disposed between the top electrode TE and the tunnel barrier layer TBL. The bottom and top electrodes BE and TE may include a conductive metal nitride (e.g., titanium nitride, tantalum nitride, and/or tungsten nitride).

Figure 5C:
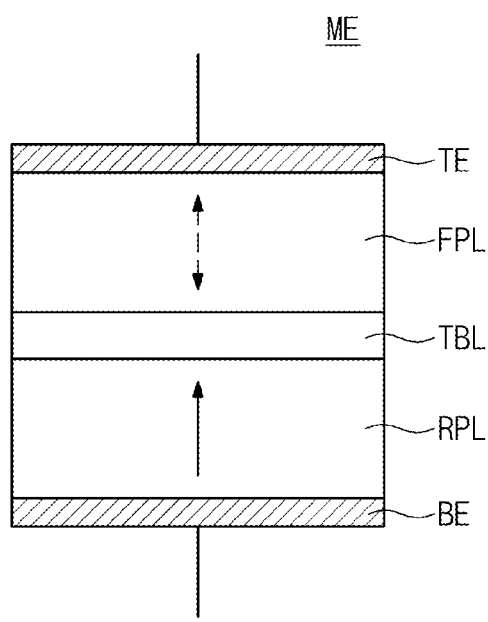

According to an embodiment illustrated in FIG. 5C, each of the data storage pattern ME may include a reference perpendicular magnetic layer RPL, a free perpendicular magnetic layer FPL, and a tunnel barrier layer TBL between the reference and free perpendicular magnetic layers RPL and FPL. The reference perpendicular magnetic layer RPL has a magnetization direction fixed in one direction, and the free perpendicular magnetic layer FPL may have a magnetization direction changeable between a direction parallel to and a direction anti-parallel to the magnetization direction of the reference perpendicular magnetic layer RPL. The magnetization directions of the reference and free perpendicular magnetic layers RPL and FPL may be substantially perpendicular to a top surface of the tunnel barrier layer TBL.

Each of the reference and free perpendicular magnetic layers RPL and FPL may include a perpendicular magnetic material (e.g., CoFeTb, CoFeGd, and/or CoFeDy), a perpendicular magnetic material having a $L1_0$ structure, or CoPt having a hexagonal close packed (HCP) lattice structure. Here, the perpendicular magnetic material having the $L1_0$ structure may include at least one of FePt of the $L1_0$ structure, FePd of the $L1_0$ structure, CoPd of the $L1_0$ structure, or CoPt of the $L1_0$ structure.

In other embodiments, each of the reference and free perpendicular magnetic layers RPL and FPL may include magnetic layers and non-magnetic layers which are alternately and repeatedly stacked. For example, each of the reference and free perpendicular magnetic layers RPL and FPL may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" is a natural number equal to or greater than 2. Here, the reference perpendicular magnetic layer RPL may be thicker than the free perpendicular magnetic layer FPL, and/or a coercive force of the reference perpendicular magnetic layer RPL may be greater than that of the free perpendicular magnetic layer FPL.

The tunnel barrier layer TBL may include at least one of magnesium oxide, titanium oxide, aluminum oxide, magnesium-zinc oxide, or magnesium-boron oxide.

Each of the data storage patterns ME may further include a bottom electrode BE and a top electrode TE. The bottom and top electrodes BE and TE may be formed of a conductive metal nitride. The reference perpendicular magnetic layer RPL, the tunnel barrier layer TBL, and the free perpendicular magnetic layer FPL may be sequentially stacked between the bottom electrode BE and the top electrode TE. Alternatively, positions of the reference and free perpendicular magnetic layers RPL and FPL may be counterchanged with each other. In other words, the free perpendicular magnetic layer FPL, the tunnel barrier layer TBL, and the reference perpendicular magnetic layer RPL may be sequentially stacked between the bottom electrode BE and the upper electrode TE.

Figure 5D:
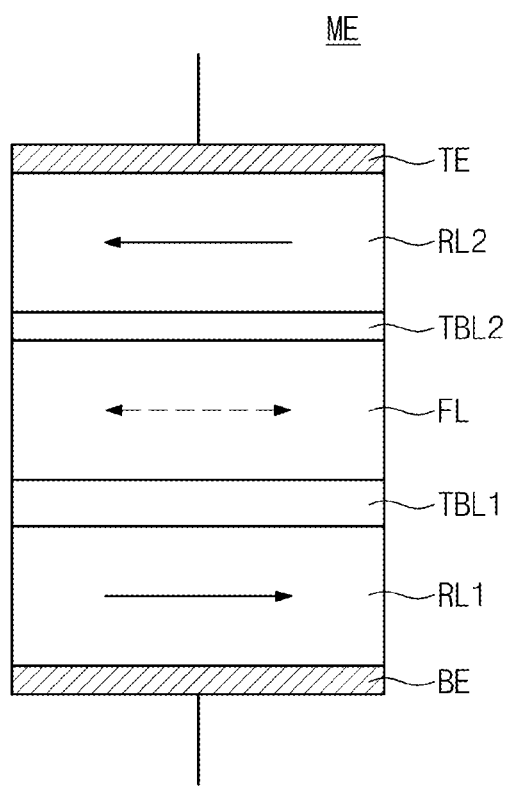

According to an embodiment illustrated in FIG. 5D, each of the data storage patterns ME may include a first MTJ and a second MTJ.

In more detail, each of the data storage patterns ME may include a first reference magnetic layer RL1, a first tunnel barrier layer TBL1, a free magnetic layer FL, a second tunnel barrier layer TBL2, and a second reference magnetic layer RL2 which are sequentially stacked. Here, a thickness of the first tunnel barrier layer TBL1 may be different from a thickness of the second tunnel barrier layer TBL2. The first reference magnetic layer RL1, the first tunnel barrier layer TBL1, and the free magnetic layer FL may constitute the first MTJ, and the free magnetic layer FL, the second tunnel barrier layer TBL2, and the second reference magnetic layer RL2 may constitute the second MTJ.

The first and second reference magnetic layers RL1 and RL2 may have fixed magnetization directions. Here, the magnetization direction of the first reference magnetic layer RL1 may be anti-parallel to the magnetization direction of the second reference magnetic layer RL2. The free magnetic layer FL may have a magnetization direction changeable between a direction parallel to and a direction anti-parallel to any one of the magnetization directions of the first and second reference magnetic layers RL1 and RL2. The magnetization directions the free magnetic layer FL and the first and second reference magnetic layers RL1 and RL2 may be substantially parallel or perpendicular to top surfaces of the first and second tunnel barrier layers TBL1 and TBL2.

Each of the data storage patterns ME may include a bottom electrode BE and a top electrode TE. The bottom and top electrodes BE and TE may be formed of a conductive metal nitride. The reference magnetic layer RL1, the first tunnel barrier layer TBL1, the free magnetic layer FL, the second tunnel barrier layer TBL2, and the second reference magnetic layer RL2 may be sequentially stacked between the bottom electrode BE and the upper electrode TE.

Figure 5E:
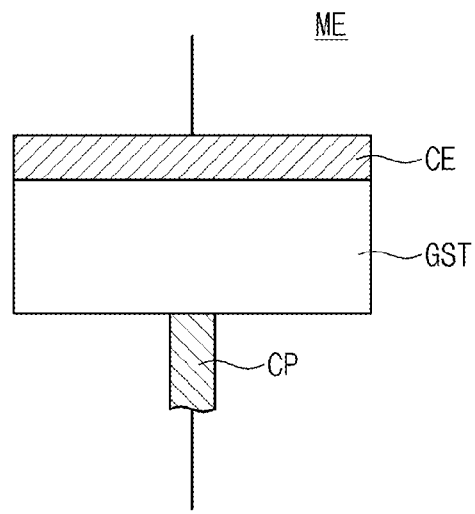

According to an embodiment illustrated in FIG. 5E, each of the data storage patterns ME may include a phase change material pattern GST and a capping electrode CE that are sequentially stacked. A phase of the phase change material pattern GST may be changed into a crystalline state or an amorphous state by a temperature of supplied heat and/or a supplying time of the heat. The phase change material pattern GST of the crystalline state may have a resistivity lower than that of the phase change material pattern GST of the amorphous state. Each of the data storage patterns ME may store data using a resistivity difference caused by the change of the phase of the phase change material pattern GST. In some embodiments, a cell contact plug CP contacting the phase change material pattern GST may be used as a heating electrode. In this case, a portion of the phase change material pattern GST adjacent to the cell contact plug CP may correspond to a programmable region. A phase of the programmable region may be changed into any one of the crystalline state and the amorphous state.

The phase change material pattern GST may include at least one of as tellurium (Te) and selenium (Se) which are chalcogenide elements. For example, the phase change material GST may include at least one of of Ge—Sb—Te, As—Sb—Te, As—Ge—Sb—Te, Sn—Sb—Te, Ag—In—Sb—Te, In—Sb—Te, a 5A group element-Sb—Te, a 6A group element-Sb—Te, a 5A group element-Sb—Se, a 6A group element-Sb—Se, Ge—Sb, In—Sb, Ga—Sb, or a doped Ge—Sb—Te. Here, the doped Ge—Sb—Te may be doped with at least one of C, N, B, Bi, Si, P, Al, Dy, or Ti. Each of the capping electrode CE and the cell contact plug CP may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Figure 5F:
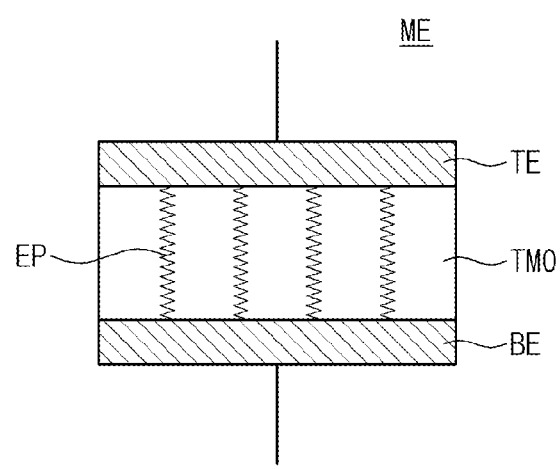

According to an embodiment illustrated in FIG. 5F, each of the data storage patterns ME may include a bottom electrode BE, a top electrode TE, and a transition metal oxide pattern TMO disposed between the bottom electrode BE and top electrode TE. At least one electrical path EP may be created or lost in the transition metal oxide pattern TMO by a programming operation. Both ends of the electrical path EP may be connected to the bottom and top electrodes BE and TE, respectively. Each of the data storage patterns ME may have a low resistance value in the event that the electrical path EP is created, but each of the data storage patterns ME may have a high resistance value in the vent that the electrical path EP is lost. Each of the data storage patterns ME may store data using a resistance value difference caused by the electrical path EP. The electrical path EP may be created or lost by a programming operation.

For example, the transition metal oxide pattern TMO may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, or barium-strontium-zirconium oxide.

The bottom and top electrodes BE and TE may include at least one of a conductive metal nitride (e.g., titanium nitride or tantalum nitride), a transition metal (e.g., titanium or tantalum), or a rare-earth element (e.g., ruthenium or platinum).

A method of operating the semiconductor memory device according to embodiments will be described in more detail with reference to FIGS. 6, 7, 8A, 8B, 9, and 10.

Figure 6:
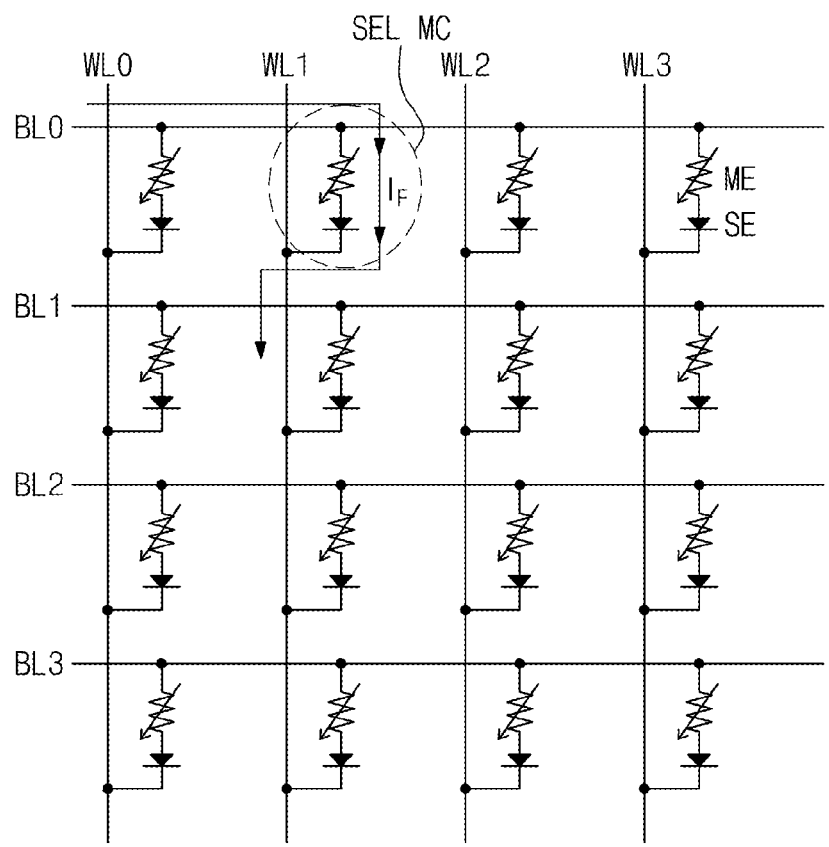
FIGS. 6 and 7 are circuit diagrams for reference in explaining an operation of a semiconductor memory device according to an exemplary embodiment of the inventive concept.
Figure 7:
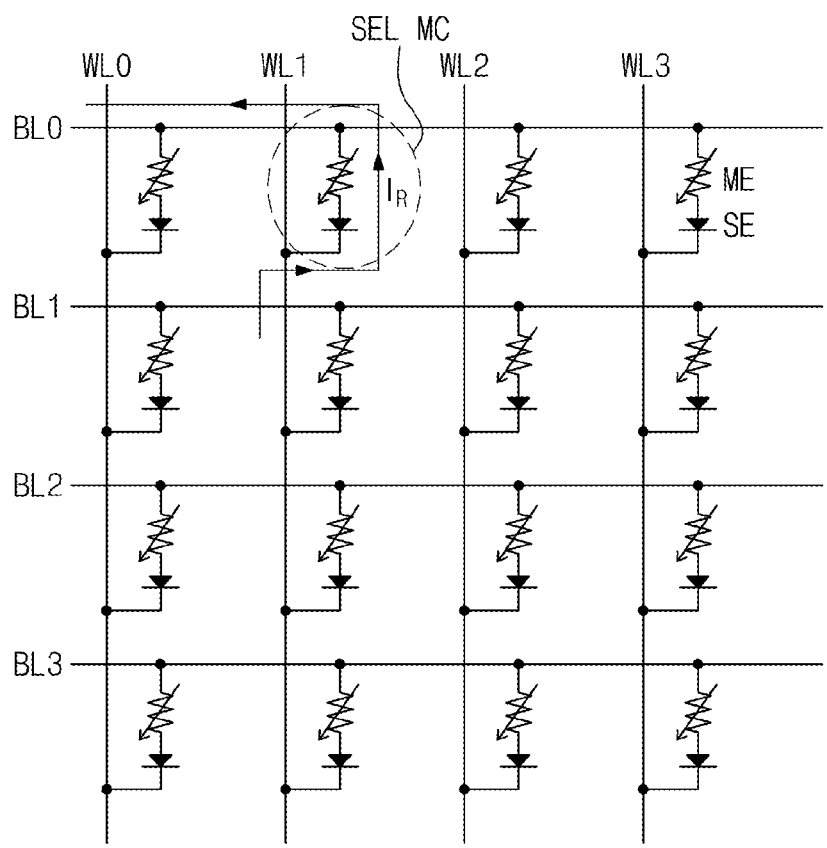
Figure 8A:
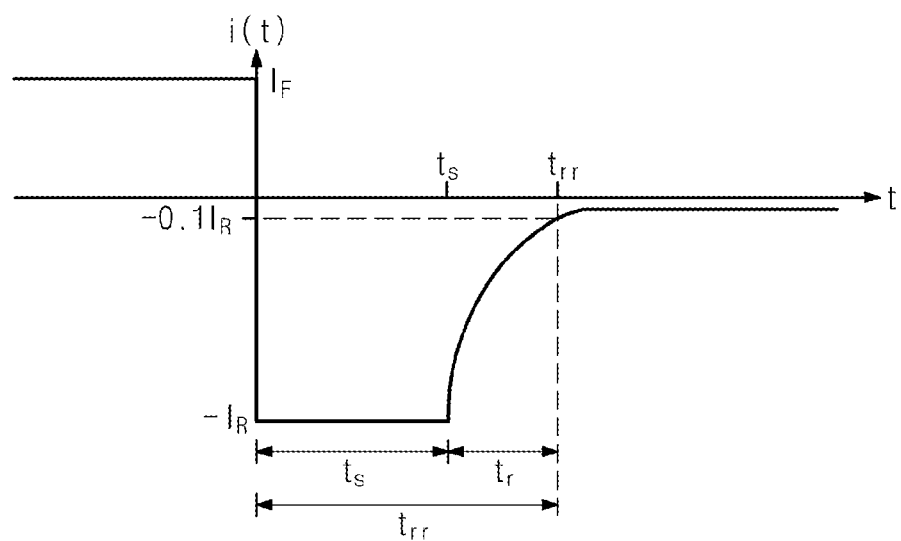
FIGS. 8A and 8B are graphs illustrating operating characteristics of a selection element of a semiconductor memory device according to an exemplary embodiment of the inventive concept.
Figure 8B:
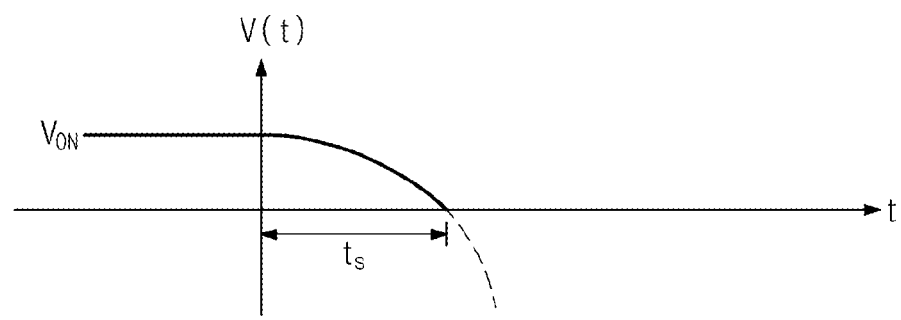

FIGS. 6 and 7 are circuit diagrams to explain operation of a semiconductor memory device according to an exemplary embodiment of the inventive concept. FIGS. 8A and 8B are graphs illustrating an operating characteristic of a selection element of a semiconductor memory device according to an exemplary embodiment of the inventive concept.

Referring to FIGS. 6 and 7, one memory cell SEL MC may be selected in order to write data. In other words, one of the word lines WL0 to WL3 may be selected, and one of the bit lines BL0 to BL3 may be selected.

In some embodiments, a first forward bias may be provided to the PN junction diode of the selected memory cell SEL MC in order to write data of "0" into the selected memory cell SEL MC. Thus, a first directional current $I_F$ flowing from the selected bit line BL0 to the selected word line WL1 may be supplied to the memory element ME of the selected memory cell SEL MC.

In an embodiment, a second directional current $I_R$ flowing from the selected word line WL1 to the selected bit line BL0 may be supplied to the memory element ME in order to write data of "1" into the selected memory cell SEL MC. To achieve this, a reverse bias may be provided to the PN junction diode of the selected memory cell SEL MC immediately after a second forward bias is provided to the PN junction diode of the selected memory cell SEL MC. Here, a time for which the second forward bias is provided may be shorter than a time for which the first forward bias is provided. When a forward bias is provided to the PN junction diode, a potential barrier may be lowered at the junction of the PN junction diode. Thus, majority carriers may be diffused into an opposite semiconductor, so the first directional current $I_F$ flows. The diffused majority carriers may gradually disappear to become minority carriers in the opposite semiconductor, and excess minority carriers may be accumulated in a quasi-neutral region of the PN junction diode. If the reverse bias is provided to the PN junction diode when the excess minority carriers exist in N-type and P-type semiconductors of the PN junction diode, the second directional current $I_R$ having a substantially same amount as the first directional current $I_F$ may flow for a certain time by the excess minority carries (i.e., minority carriers which not disappear). In other words, when the forward bias is provided to the PN junction diode to supply the first direction current $I_F$ to the memory element ME and then the reverse bias is abruptly provided, the second directional current $I_R$ having the substantially same amount as the first directional current $I_F$ may flow through the memory element ME for a storage delay time $t_S$ of the PN junction diode, as illustrated in FIG. 8A. After the storage delay time $t_S$, the second directional current $I_R$ may be exponentially reduced for a predetermined time $t_r$ to become close to zero (0). In addition, as illustrated in FIG. 8B, when the forward bias is provided and then the reverse bias is provided to the PN junction diode, a voltage applied to the PN junction diode may also be reduced for the storage delay time $t_S$ and be then interrupted. That is, in some embodiments, data of "1" may be written in the selected memory cell SEL MC within a reverse recovery time $t_{rr}$ of the PN junction diode.

In the memory cell using the PN junction diode as the selection element SE, a time for which the second directional current $I_R$ is supplied to the memory element ME may be varied depending on a lifetime of the minority carrier. Here, the lifetime of the minority carrier increases as a doping concentration of the semiconductor forming the PN junction diode is reduced. In some embodiments, the time for the second directional current $I_R$ to be supplied to the memory element ME may be longer than a time for which a resistance state of the memory element ME is switched.

In some embodiments, the PN junction diode may be formed of silicon. A concentration of N-type dopants may be in a range of about $1 \times 10^{17}/cm^3$ to about $1 \times 10^{18}/cm^3$ in an N-type region of the PN junction diode, and a concentration of P-type dopants may be in a range of about $1 \times 10^{20}/cm^3$ to about $1 \times 10^{21}/cm^3$ in a P-type region of the PN junction diode. The storage delay time $t_S$ of the PN junction diode may be dependent on the concentration of the N-type dopants and may be in a range of about 50 ns to about 100 ns.

In addition, a time for which the first directional current $I_F$ is changed into the second directional current $I_R$ may be dependent on a RC delay time caused by the selected bit line BL0 and the memory element ME. The RC delay time may be shorter than the supply time of the second directional current $I_R$.

Figures 9, 10:
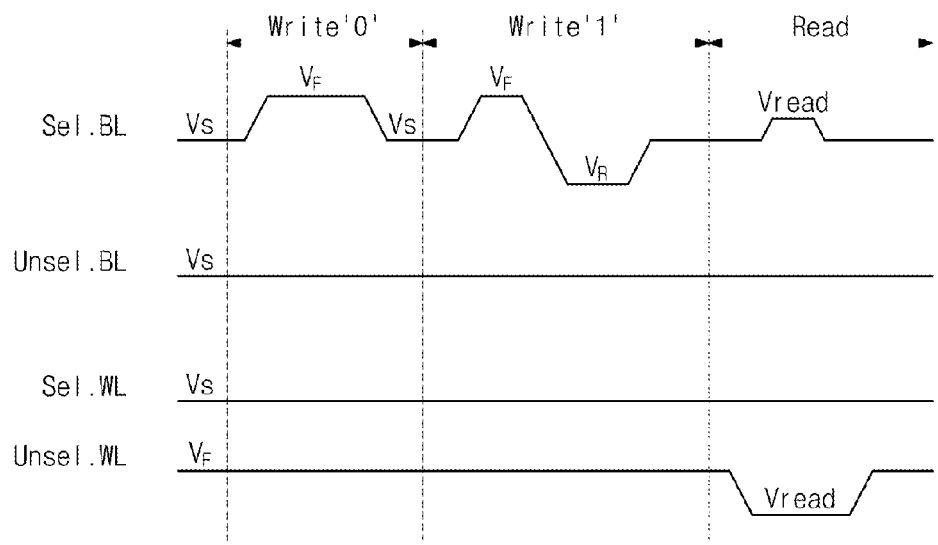
FIG. 9 is a table illustrating driving voltages of a semiconductor memory device according to an exemplary embodiment of the inventive concept.
FIG. 10 an operational timing diagram of a semiconductor memory device according to an exemplary embodiment of the inventive concept.

FIG. 9 is a table illustrating driving voltages of a semiconductor memory device according to an exemplary embodiment of the inventive concept. FIG. 10 an operational timing diagram of a semiconductor memory device according to example embodiments of the inventive concepts.

Referring to FIGS. 9 and 10, for writing data of '0' into a selected memory cell, a first voltage $V_S$ may be applied to a selected word line Sel.WL, and a second voltage $V_F$ greater than the first voltage $V_S$ may be applied to unselected word lines Unsel.WL. The second voltage $V_F$ may be applied to a selected bit line Sel.BL, and the first voltage $V_S$ may be applied to unselected bit lines Unsel.BL. For example, the second voltage $V_F$ of about 2.5V may be applied to the selected bit line Sel.BL, and the first voltage $V_S$ of about 1V may be applied to unselected bit lines Unsel.BL. Under these voltage conditions, a predetermined voltage difference (i.e., $V_F-V_S$) may be applied between both ends of the selected memory cell to provide a forward bias to the PN junction diode corresponding to the selection element. Thus, the first directional current flowing from the selected bit line Sel.BL to the selected word line Sel.WL may be provided to the selected memory cell, as described with reference to FIG. 6.

Since the voltage difference is not provided to first unselected memory cells connected between the selected bit line Sel.BL and the unselected word lines Unsel.WL, a current flow does not occur through the first unselected memory cells. Likewise, since the voltage difference is not provided to second unselected memory cells connected between the selected word line Sel.WL and unselected bit lines Unsel.BL, a current flow does not occur through the second unselected memory cells. Moreover, since a reverse bias is applied to PN junction diodes of third unselected memory cells connected between the unselected bit lines Unsel.BL and the unselected word lines Unsel.WL, a current flow may be restricted through the third unselected memory cells by a rectification characteristic of the PN junction diodes.

A method of writing data of '1' in the selected memory cell will be described. The first voltage $V_S$ may be applied to the selected word line Sel.WL, and the second voltage $V_F$ may be applied to the unselected word lines Unsel.WL. Immediately after the second voltage $V_F$ is applied to the selected bit line Sel.BL, a third voltage $V_R$ less than the first voltage $V_S$ may be applied to the selected bit line Sel.BL. For example, a voltage of about 1V may be applied to the selected word line Sel.WL, and a voltage of about 0V may be applied to the selected bit line Sel.BL immediately after a voltage of about 2.5V is applied to the selected bit line Sel.BL. Here, a time for which the second voltage $V_F$ is applied to the selected bit line Sel.BL may be shorter than a time for which the second voltage $V_F$ is applied to the selected bit line Sel.BL when the data of '0' is written. Under these voltage conditions, the first directional current may be supplied to the selected memory cell and then the reverse bias may be abruptly applied to supply the second directional current to the selected memory cell for a predetermined time.

The voltage difference may not be provided to the first unselected memory cells connected between the selected bit line Sel.BL and the unselected word lines Unsel.WL, and the reverse bias may be then applied to the PN junction diode of the first unselected memory cells. The voltage difference is not provided to the second unselected memory cells connected to the unselected bit line Unsel.BL and the selected word line Sel.WL, so a current flow does not occur in the second unselected memory cells. The reverse bias is applied to the PN junction diodes of the third unselected memory cells connected between the unselected bit lines Unsel.BL and the unselected word lines Unsel.WL, so a current flow may be restricted in the third unselected memory cells.

Next, a read voltage $V_{READ}$ may be applied to the selected bit line Sel.BL and the unselected word lines Unsel.WL to read data stored in the selected memory cell. The read voltage $V_{READ}$ may be greater than the first voltage $V_S$ and less than the second voltage $V_F$. For example, the read voltage $V_{READ}$ may be about 1.5V. Under these voltage conditions, a read current may be applied to the selected memory cell. The read current is less than the first or second directional current capable of switching the resistance state of the memory element of the memory cell.

Figure 11:
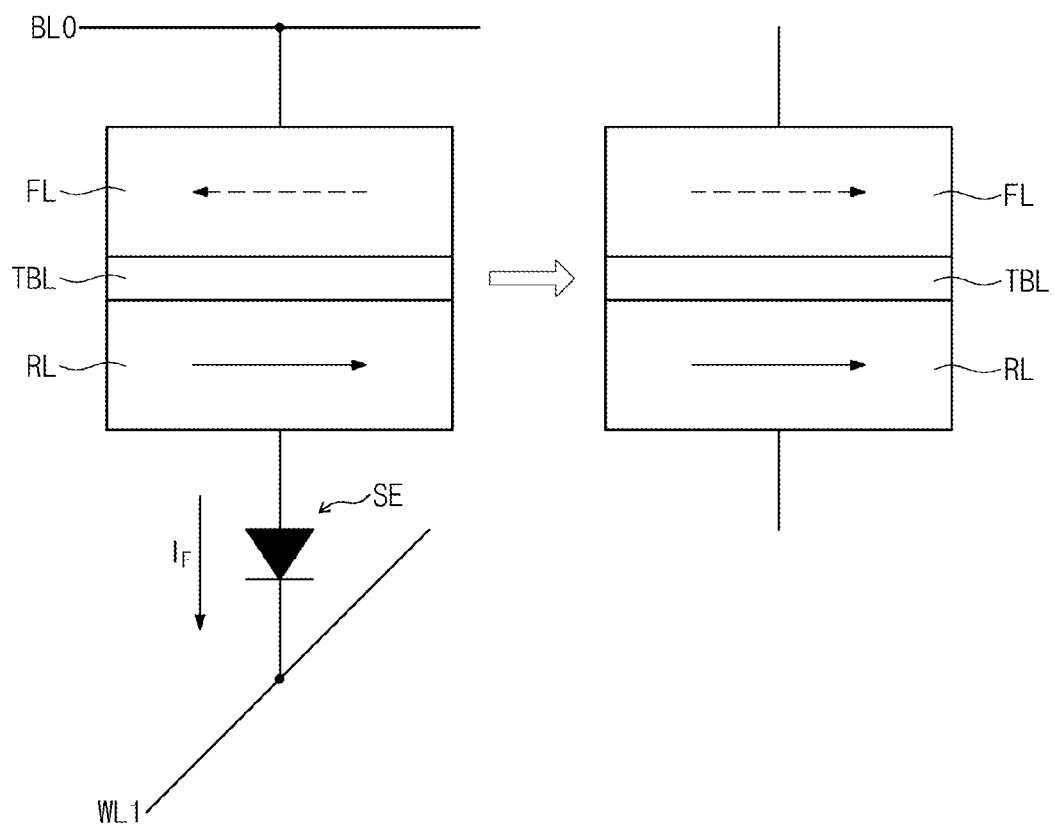
FIGS. 11 and 12 are diagrams for reference in explaining write operations of a semiconductor memory device according to an exemplary embodiment of the inventive concept.
Figure 12:
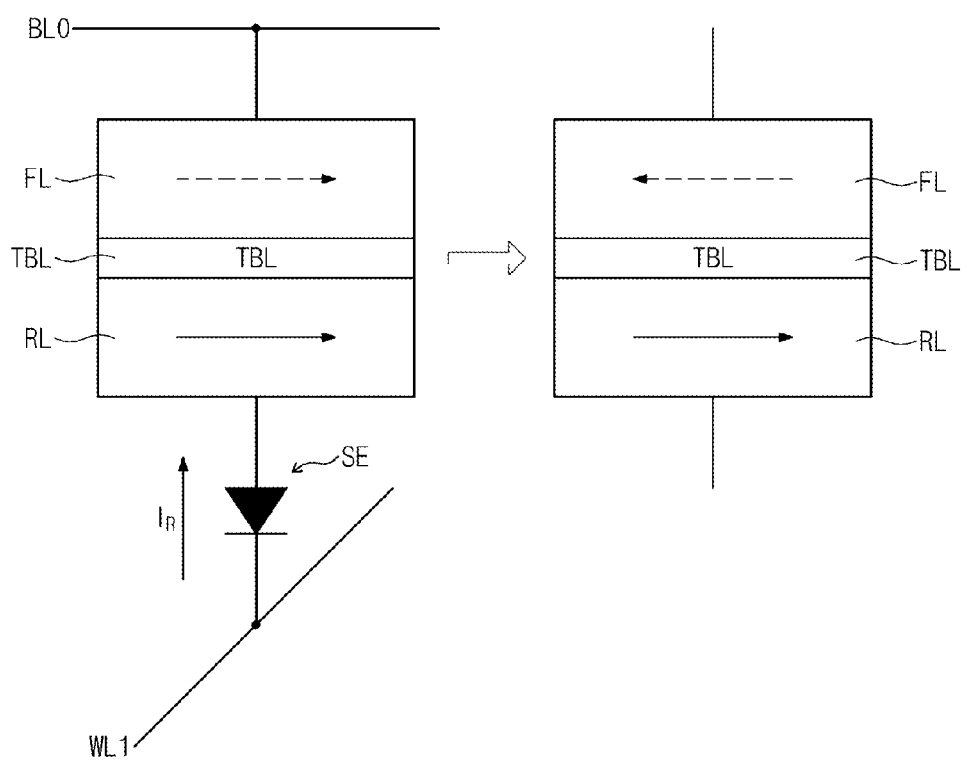

FIGS. 11 and 12 are diagrams for reference in describing write operations of a semiconductor memory device according to an exemplary embodiment of the inventive concept.

Referring to FIGS. 11 and 12, the memory element of the semiconductor memory device may include a magnetic tunnel junction (MTJ). The MTJ includes a reference magnetic layer RL, a free magnetic layer FL, and a tunnel barrier layer TBL disposed therebetween.

In the event that the magnetization directions of the reference and free magnetic layers RL and FL are parallel to each other, the MTJ may have a low resistance state. In this case, the MTJ may have data of '0'. Alternatively, in the event that the magnetization directions of the reference and free magnetic layers RL and FL are anti-parallel to each other, the MTJ may have a high resistance state. In this case, the MTJ may have data of '1'.

FIG. 11 illustrates a write operation of converting the anti-parallel state (i.e., the high resistance state or the data of '1') into the parallel state (i.e., the low resistance state or the data of '0'). As described with reference to FIGS. 9 and 10, the first voltage $V_S$ and the second voltage $V_F$ may be respectively applied to the selected word line WL1 and the selected bit line BL0 to write the data of '0' into the MTJ. In other words, the forward bias may be applied to the PN junction diode corresponding to the selection element SE. The first directional current $I_F$ flowing from the selected bit line BL0 to the selected word line WL1 may switch the magnetization direction of the free magnetic layer FL, so the magnetization directions of the reference and free magnetic layers RL and FL may be parallel to each other.

FIG. 12 illustrates a write operation of converting the parallel state (i.e., the low resistance state or the data of '0') into the anti-parallel state (i.e., the high resistance state or the data of '1'). As described with reference to FIGS. 9 and 10, the first voltage $V_S$ may be applied to the selected word line WL1 and the second voltage $V_F$ and the third voltage $V_R$ may be sequentially applied to the selected bit line BL0, so the MTJ may be written with the data of '1'. Thus, the forward bias and the reverse bias may be sequentially applied to the PN junction diode of the selection element SE. In other words, immediately after the forward bias is applied to the PN junction diode, the reverse bias is applied to the PN junction diode. As a result, the first directional current $I_F$ may flow through the memory cell, and the second directional current $I_R$ may then flow through the memory cell for a certain time. Here, the second direction current $I_R$ may switch the magnetization direction of the free magnetic layer FL, so the magnetization directions of the reference and free magnetic layers RL and FL may be anti-parallel to each other. The supply time of the second directional current $I_R$ (i.e., the storage delay time of the PN junction diode) may be longer than a switching time of the free magnetic layer FL.

As described above, the resistance state of the memory element may be switched using the reverse current of the PN junction diode occurring when the forward bias is applied and then the reverse bias is abruptly provided to the PN junction diode. As a result, an integration degree of the semiconductor memory device may be improved, and the semiconductor memory device may be stably operated.

The semiconductor memory devices described above may be package according to any of a variety of packaging technologies. For example, the semiconductor memory devices according to the aforementioned embodiments may be packaged according to any of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 13:
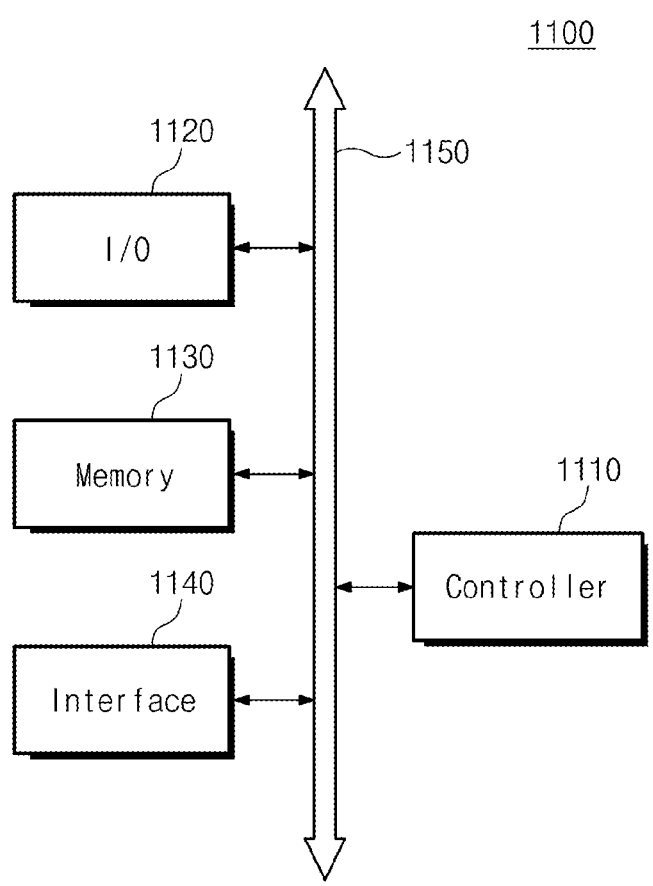
FIG. 13 is a schematic block diagram illustrating an electronic system including a semiconductor memory device according to an exemplary embodiment of the inventive concept.

FIG. 13 is a schematic block diagram of an electronic system including a semiconductor memory device according to an embodiment of the inventive concept.

Referring to FIG. 13, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 114 may include the semiconductor memory devices according to embodiments of the inventive concepts.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast static random access memory (SRAM) device which acts as a working memory device for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 14:
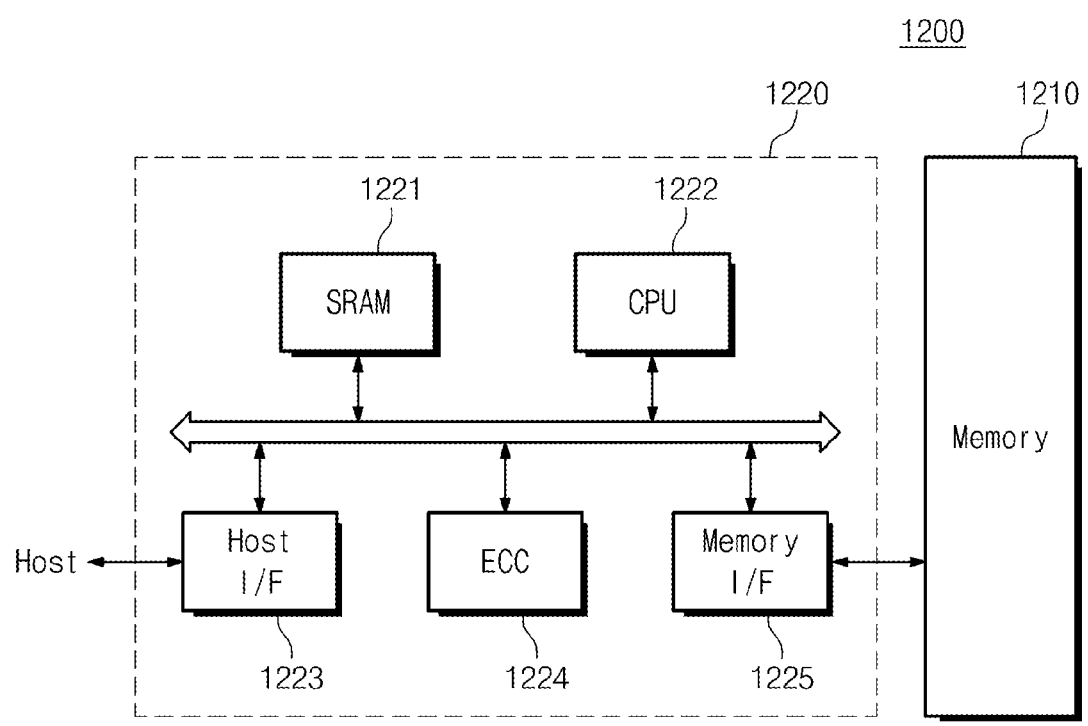
FIG. 14 is a schematic block diagram illustrating a memory card including a semiconductor memory device according to an exemplary embodiment of the inventive concept.

FIG. 14 is a schematic block diagram of a memory card including a semiconductor memory device according to an exemplary embodiment of the inventive concept.

Referring to FIG. 14, a memory card 1200 includes a memory device 1210. The memory device 1210 may include at least one of the semiconductor memory devices according to the embodiments mentioned above. In addition, the memory device 1210 may further include another type of semiconductor memory devices which are different from the semiconductor memory devices according to the embodiments described above. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

Figure 15:
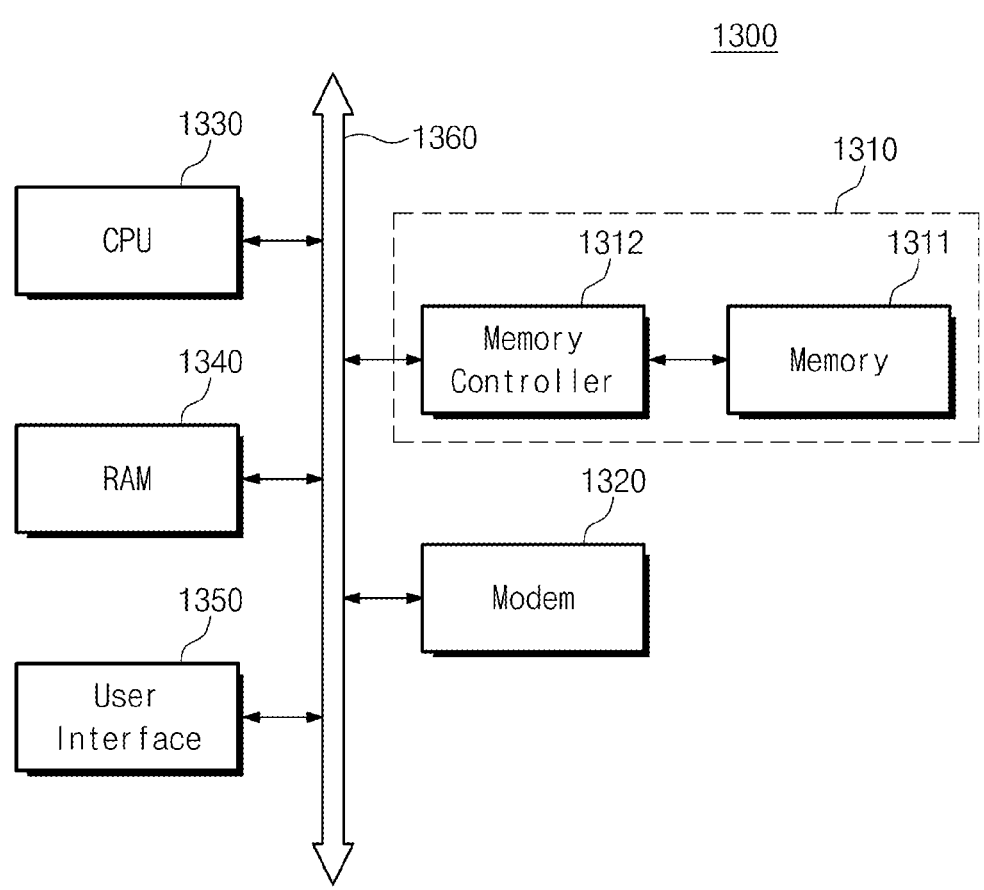
FIG. 15 is a schematic block diagram illustrating an information processing system including a semiconductor memory device according to an exemplary embodiment of the inventive concept.

FIG. 15 is a schematic block diagram of an information processing system including a semiconductor memory device according to an exemplary embodiment of the inventive concept.

Referring to FIG. 15, at least one of the semiconductor memory devices according to the aforementioned embodiments may be installed in a memory system 1310, and the memory system 1310 may be installed in an information processing system 1300 such as a mobile device or a desk top computer. The information processing system 1300 according to embodiments may include a modem 1320, a central processing unit (CPU) 1330, a random access memory (RAM) 1340, and a user interface unit 1350 that are electrically connected to a memory system 1310 through a system bus 1360. The memory system 1310 may have substantially the same structure as the memory card 1200 described with reference to FIG. 14. In other words, the memory system 1310 may include a memory device 1311 and a memory controller 1312 controlling overall operations of the memory device 1311. The memory system 1310 may store data processed by the CPU 1330 or data inputted from an external system.

The information processing system 1300 may further include an application chipset, a camera image processor (CIS), and/or an input/output unit.

According to embodiments of the inventive concepts, the PN junction diode corresponding to two-terminal element is used as the selection element of the semiconductor memory device, and as a result the semiconductor memory device may be highly integrated. In addition, the semiconductor memory device may use the reverse directional current occurring when the forward bias is applied to the PN junction diode and then the reverse bias is abruptly applied to the PN junction diode, and thus, bidirectional currents may be supplied to the memory element. As a result, the integration degree of the semiconductor memory device may be improved, and the semiconductor memory device may be stably operated.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of operating a semiconductor memory device comprising a PN junction diode and a variable resistance memory element connected in series between first and second conductive lines intersecting each other, the method comprising:
supplying the variable resistance memory element with a first directional current flowing from the second conductive line to the first conductive line by applying a first forward bias to the PN junction diode; and
supplying the variable resistance memory element with a second directional current flowing from the first conductive line to the second conductive line by applying a reverse bias to the PN junction diode immediately after applying a second forward bias to the PN junction diode.

2. The method of claim 1, wherein a time in which the second forward bias is applied is shorter than a time in which the first forward bias is applied.

3. The method of claim 1, wherein supplying the variable resistance memory element with the first directional current comprises switching the variable resistance memory element from a first resistance state to a second resistance state, and
wherein supplying the variable resistance memory element with the second directional current comprises switching the variable resistance memory element from the second resistance state to the first resistance state.

4. The method of claim 3, wherein a time for supplying the second directional current is shorter than a time for supplying the first directional current and is longer than a time for switching the variable resistance memory element from the second resistance state to the first resistance state.

5. The method of claim 1, wherein supplying the variable resistance memory element with the first directional current comprises:
applying a first voltage level to the first conductive line; and
applying a second voltage level greater than the first voltage level to the second conductive line, and
wherein supplying the variable resistance memory element with the second directional current comprises:
applying the first voltage level to the first conductive line; and
immediately after applying the second voltage level to the second conductive line, applying a third voltage level less than the first voltage level to the second conductive line.

6. The method of claim 1, wherein the variable resistance memory element comprises a magnetic tunnel junction including a reference magnetic layer, a free magnetic layer, and a tunnel barrier layer disposed there between.

7. The method of claim 6, wherein a time for supplying the second directional current is longer than a time for switching a magnetization direction of the free magnetic layer.

8. The method of claim 6, wherein supplying the variable resistance memory element with the first directional current comprises switching magnetization directions of the reference and free magnetic layers to be parallel to each other, and
wherein supplying the variable resistance memory element with the second directional current comprises switching magnetization directions of the reference and free magnetic layers to be anti-parallel to each other.

9. A method of operating a semiconductor memory device comprising first conductive lines and second conductive lines intersecting each other, switching elements connected between the first conductive lines and the second conductive lines, and variable resistance memory elements connected between the switching elements and the second conductive lines, wherein each of the switching elements including a first conductivity type semiconductor pattern and a second conductivity type semiconductor layer contacting the first conductivity type semiconductor pattern, the method comprising:
switching a selected variable resistance memory element to a first resistance state by applying a first voltage level to the second conductive line connected to the selected variable resistance memory element; and switching the selected variable resistance memory element to a second resistance state by applying a second voltage level less than the first voltage level to the second conductive line connected to the selected variable resistance memory element immediately after applying the first voltage level to the second conductive line connected to the selected variable resistance memory element.

10. The method of claim 9, wherein a time for the first voltage level to be applied when the selected variable resistance memory element is switched to the second resistance state is shorter than a time for the first voltage level to be applied when the selected variable resistance memory element is switched to the first resistance state.

11. The method of claim 9, wherein a third voltage level less than the first voltage level and greater than the second voltage level is applied to the first conductive line connected to the selected variable resistance memory element.

12. The method of claim 9, wherein the first conductivity type semiconductor pattern is in contact with one of the first conductive lines, and the second conductivity type semiconductor pattern is in contact with one of the variable resistance memory elements, and wherein a dopant concentration in the first conductivity type semiconductor pattern is lower than a dopant concentration in the second conductivity type semiconductor pattern.

13. The method of claim 12, wherein the dopant concentration in the first conductivity type semiconductor pattern is in a range of about $1 \times 10^{17}/cm^3$ to about $1 \times 10^{18}/cm^3$, and wherein the dopant concentration in the second conductivity type semiconductor pattern is in a range of about $1 \times 10^{20}/cm^3$ to about $1 \times 10^{21}/cm^3$.

14. The method of claim 9, wherein switching the variable resistance memory element to the second resistance state comprises immediately after accumulating minority carries in the first conductivity type semiconductor pattern and the second conductivity type semiconductor pattern, discharging the accumulated minority carriers.

15. The method of claim 9, wherein switching the variable resistance memory element to the first resistance state comprises supplying a first directional current flowing from the second conductive line to the first conductive line connected to the selected variable resistance memory element, and wherein switching the variable resistance memory element to the second resistance state comprises supplying a second directional current flowing from the first conductive line to the second conductive line connected to the selected variable resistance memory element.

16. The method of claim 15, wherein a time for the second directional current to be supplied is shorter than a time for the first directional current to be supplied and is longer than a time for the variable resistance memory element to be switched from the first resistance state to the second resistance state.

17. The method of claim 9, further comprising:

applying the first voltage level to the first conductive line connected to an unselected variable resistance memory element; and applying a third voltage level to the second conductive line connected to the unselected variable resistance memory element, wherein the third voltage level is less than the first voltage level and greater than the second voltage level.

18. The method of claim 9, wherein each of the variable resistance memory elements comprises a magnetic tunnel junction including a reference magnetic layer, a free magnetic layer, and a tunnel barrier layer disposed therebetween, wherein a time for the first voltage level to be applied when the selected variable resistance memory element is switched to the second resistance state is longer than a time for a magnetization direction of the free magnetic layer to be switched, wherein switching the variable resistance memory element to the first resistance state comprises switching magnetization directions of the reference and free magnetic layers to be parallel to each other, and wherein switching the variable resistance memory element to the second resistance state comprises switching magnetization directions of the reference and free magnetic layers to be anti-parallel to each other.

19. A method of operating a variable resistance memory device, the method comprising:

applying a first forward bias to a PN junction diode for supplying a variable resistance memory element with a first directional current flowing from a second conductive line to a first conductive line;

applying a second forward bias to the PN junction diode; and applying a reverse bias to the PN junction diode immediately after applying the second forward bias, for supplying the variable resistance memory element with a second directional current flowing from the first conductive line to the second conductive line.

20. The method of claim 19, wherein the variable resistance memory element is connected between first and second conductive lines intersecting each other, and the PN junction diode is connected between the variable resistance memory element and the first conductive line.

* * * * *